United States Patent [19]

Kornrumpf et al.

[11] 4,356,525
[45] Oct. 26, 1982

[54] METHOD AND CIRCUIT FOR CONTROLLING A HYBRID CONTACTOR

[75] Inventors: William P. Kornrumpf, Schenectady; Joseph L. Ciccone, Albany, both of N.Y.

[73] Assignee: General Electric Company, Schenectady, N.Y.

[21] Appl. No.: 222,412

[22] Filed: Jan. 5, 1981

[51] Int. Cl.³ .............................................. H02H 3/00
[52] U.S. Cl. ........................................... 361/4; 361/3; 361/13
[58] Field of Search ...................... 361/3, 2, 4, 8, 11, 361/13, 58

[56] References Cited

U.S. PATENT DOCUMENTS

| | | | |
|---|---|---|---|
| 3,446,991 | 5/1969 | Howell | 307/252 |
| 3,466,503 | 9/1969 | Goldberg | 317/11 |
| 3,504,233 | 3/1970 | Hurtle | 317/11 |
| 3,633,069 | 1/1972 | Bernard | 317/11 E |
| 3,736,466 | 5/1973 | Fox et al. | 317/11 A |
| 3,783,305 | 1/1974 | Lefferts | 307/136 |
| 4,068,273 | 1/1978 | Metzler | 361/3 |
| 4,074,333 | 2/1978 | Murakami et al. | 361/13 |
| 4,152,634 | 5/1979 | Penrod | 318/739 |
| 4,296,449 | 10/1981 | Eichelberger | 361/13 X |

Primary Examiner—Reinhard J. Eisenzopf
Attorney, Agent, or Firm—Geoffrey H. Krauss; James C. Davis, Jr.; Marvin Snyder

[57] ABSTRACT

A method and circuit for minimizing DC current offset generated by the voltage-integrating property of an inductive load. First, second and third hybrid contactors connect first, second, and third output lines of an AC power source to first, second, and third input lines of an inductive load. Each hybrid contactor includes a pair of relay contacts in parallel with a semiconductor switching unit having two antiparallel-connected silicon-controlled-rectifiers. A latching circuit and several delay circuits are used to turn on and off the hybrid contactors; the timing of the turn-on points is controlled relative to a zero-crossing of a voltage from the AC power source such that minimal DC offset current occurs.

25 Claims, 4 Drawing Figures

METHOD AND CIRCUIT FOR CONTROLLING A HYBRID CONTACTOR

BACKGROUND OF THE INVENTION

1. Field of the Invention

The present invention relates to a method and apparatus for controlling the application of power to a load. More specifically, the present invention relates to the application of three-phase power to an inductive load by way of a hybrid contactor system.

2. Description of the Prior Art

The use of hybrid contactors for providing loads with large amounts of current is well known. Generally, such hybrid contactors use a semiconductor device in parallel to a pair of relay contacts. The semiconductor device avoids, or minimizes any arcing which would otherwise occur in the relay contacts. The arcing might otherwise cause carbon build-up between the relay contacts and, eventually, necessitate the replacement of the relay contacts. Moreover, the use of the semiconductor switching devices minimizes transient effects on the load caused by the bouncing of the relay contacts on either the make or break of a circuit. Such hybrid contactor systems are shown for example by U.S. Pat. Nos. 3,466,503, issued to Goldberg; 3,446,991, issued to Howell; 3,504,233, issued to Hurtle, and 3,736,466, issued to Fox et al., all assigned to the assignee of the present invention. Another such hybrid contactor system is disclosed in the co-pending and commonly assigned application for "Relay Switching Apparatus" by Charles W. Eichelberger, Ser. No. 69,618, filed on Aug. 27, 1979, now U.S. Pat. No. 4,296,449, issued Oct. 20, 1981.

Hybrid contactor systems have been especially helpful in allowing the use of switches having lower current ratings than would otherwise be possible. Since switches rated for higher current levels tend to be more expensive, it is generally advantageous to use contactors or switches having lower current ratings. However, in powering a motor, transformer, or other inductive load from an AC source, the switches must be rated to withstand the DC offset current which is caused by the voltage-integrating properties of the inductor. In other words, the switches must be rated for higher current levels than would be the case for a noninductive load.

It is therefore an object of the present invention to provide a method and circuit for supplying AC power from a source to an inductive load.

A more specific object of the present invention is to provide a method and circuit for avoiding DC offset in an inductive load.

A further object of the present invention is to provide a hybrid contactor system which minimizes arcing and other deleterious effects which are relatively common in the making and breaking of circuits carrying large amounts of current.

Yet another object of the present invention is to provide a control circuit for switching on three-phase power to an inductive load so as to minimize any DC offset current caused by the integrating characteristics of the inductive load.

SUMMARY OF THE INVENTION

The above and further objects of the present invention are accomplished by using a hybrid contactor between each of the three output lines of a three-phase power source and each of three corresponding input lines of an inductive load. Each hybrid contactor includes a pair of relay contacts in parallel with a semiconductor switching unit. Each semiconductor switching unit is realized by two antiparallel silicon-controlled-rectifiers. In energizing the inductive load, current is supplied thereto by first switching two of the semiconductor switching units between the two corresponding output lines of the three-phase AC power source. The timing of the turn on of the hybrid contactors and closure of the relay contacts is controlled relative to a zero-crossing of an AC power source waveform such that minimal DC offset current occurs. With respect to the first two semiconductor switching points, closure of the relay contacts is caused to occur at the peak, or middle, of a half-cycle of the relative voltage waveform between the two corresponding output lines. The third of the semiconductor switching units is switched approximately 80° after that voltage peak and the corresponding relay contacts are then closed. Arcing is avoided on turning off the power by breaking the relay contacts, while the semiconductor switching units are still turned on, and switching off the semiconductor switches after the contacts have opened. The switching on and off of the semiconductor switching units and closure of the relay contacts is controlled by a zero-crossing detect circuit in combination with several delay circuits.

BRIEF DESCRIPTION OF THE DRAWINGS

These and other features of the present invention and the attendant advantages will be readily apparent to those having ordinary skill in the art and the invention will be more easily appreciated from the following detailed description of the preferred embodiments of the present invention taken in conjuction with the accompanying drawings, wherein like reference characters represent like parts throughout the several views.

DETAILED DESCRIPTION OF THE INVENTION

Figure 1:
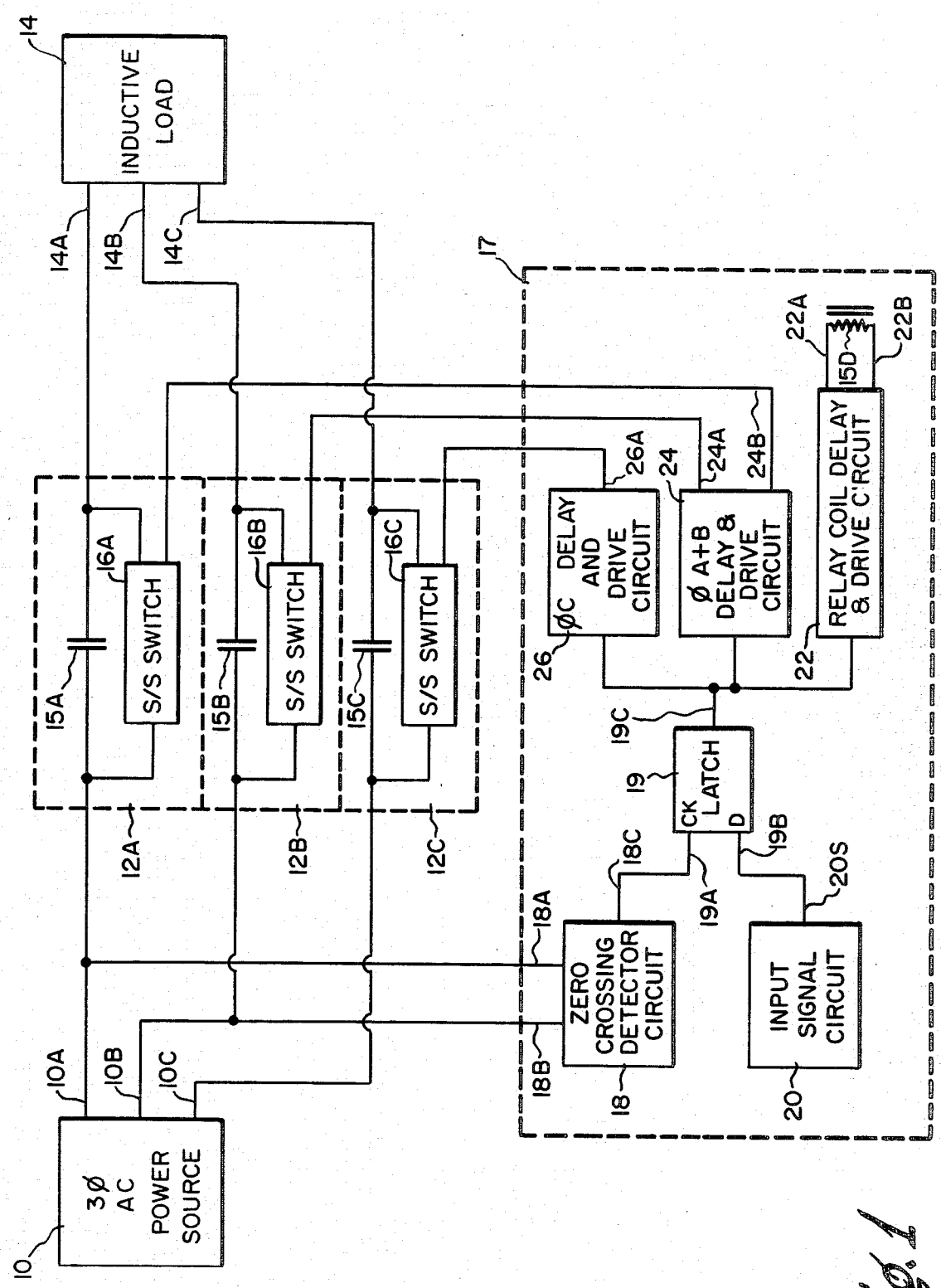
FIG. 1 is a block diagram of a circuit for implementing the present invention.

Referring now to FIG. 1, a block diagram of an embodiment of the present invention is disclosed. Specifically, a three-phase power supply 10 includes output lines 10A, 10B, and 10C which are respectively switchably connected via respective contactors 12A, 12B, and 12C to respective input lines 14A, 14B, and 14C of inductive load 14. As is customary, output lines 10 and input lines 14, as well as other interconnecting lines are illustrated by single lines, but it will be readily apparent to those skilled in the art that a "line" may be made up of one or more conductors. Hybrid contactors 12A, 12B, and 12C control the current from the respective 10A, 10B and 10C output lines and into the respective 14A, 14B, and 14C input lines. Hybrid contactor 12A is comprised of a pair of relay contacts 15A in parallel with semiconductor switching unit 16A; hybrid contactor 12B comprises a pair of relay contacts 15B in parallel with semiconductor switching unit 16B; and hybrid contactor 12C comprises a pair of relay contacts 15C in parallel with semiconductor switching unit 16C. More generically, each of hybrid contactors 12A, 12B, and 12C may be considered as a switching means, inserted between the power source and the load, which is closed when either the relay contacts or the semiconductor switching unit is switched ON. The switching means would, of course, be open only when both the relay contacts are open and the parallel semiconductor switching unit is OFF.

The hybrid contactors 12A, 12B, and 12C are controlled by control circuit 17. Together, control circuit 17 and hybrid contactors 12A, 12B, and 12C constitute a switching circuit which controls the flow of power from power source 10 to inductive load 14. Control circuit 17 includes a zero-crossing detect circuit 18 which monitors lines 10A and 10B of power source 10 by way of lines 18A and 18B. The output 18C of zero-crossing detect circuit 18 is an indicating signal pulse train, with each pulse corresponding to a zero crossing of the relative voltage waveform between the phase A and phase B voltage waveforms respectively on lines 18A and 18B. This pulse train output on line 18C is coupled to the clock CK input 19A of a latch 19 which may, for example, be a type D flip-flop logic element.

Control circuit 17 further includes an input signal circuit 20, which provides turn-on and turn-off signals at terminal 20S. The turn-on and turn-off signals respectively operate to start and to stop the flow of power from power source 10 to inductive load 14. The turn-on and turn-off signals which appear at line 20S are coupled into a latch D-input 19B. The latch output line 19C is coupled to: a relay coil delay and drive circuit 22; a phase A+B delay and drive circuit 24; and a phase C delay and drive circuit 26. When line 20S indicates a turn-on condition, the occurence of the next zero-crossing indicating signal on line 18C will cause the delay and drive circuits 22, 24, and 26 to provide outputs which will energize the semiconductor switches 16A, 16B, and 16C, and cause relay contacts 15A, 15B, and 15C to close. Specifically, after the occurence of a zero-crossing, relay coil delay and drive circuit 22 will provide current to relay coil 15D by way of terminals 22A and 22B, thereby initiating the closure of contacts 15A, 15B, and 15C. Similarly, phase A+B delay and drive circuit 24 and phase C delay and drive circuit 26 will provide signals at lines 24A, 24B, and 26A, respectively switching on semiconductor switches 16A, 16B and 16C at preset time intervals following the occurence of the zero-crossing.

It should be emphasized that, in order to start, or turn-on, the flow of power from power source 10 to inductive load 14, none of the pairs of relay contacts 15A, 15B or 15C should make, or close, before turn-on (switching to the low impedance state) of the particular semiconductor switching unit shunting the pair of relay contacts in question. In other words, the maximum voltage which will occur across the pairs of relay contacts 15A, 15B and 15C, during closure, is the very low voltage drop associated with the low impedance state of an associated semiconductor switching unit. It will thus be appreciated that arcing is minimized, or avoided, by the use of the shunting semiconductor switching units. Moreover, because a shunting semiconductor switch input will always be turned on before the associated relay contacts are closed, contact bounce will not cause any substantial transient effects on the load.

Upon the occurence of a turn-off signal on line 20S, the next zero-crossing signal at line 18C will switch the outputs of the delay and drive circuits to remove the application of power from power supply 10 to inductive load 14. Specifically, the delay and drive circuits 22, 24, and 26 will cause the opening of pairs of relay contacts 15A, 15B and 15C before the semiconductor switching units are switched to their high impedance state, i.e. turned off. This will substantially eliminate any arcing which might otherwise be caused across the relay contacts 15A, 15B and 15C.

Figure 2:
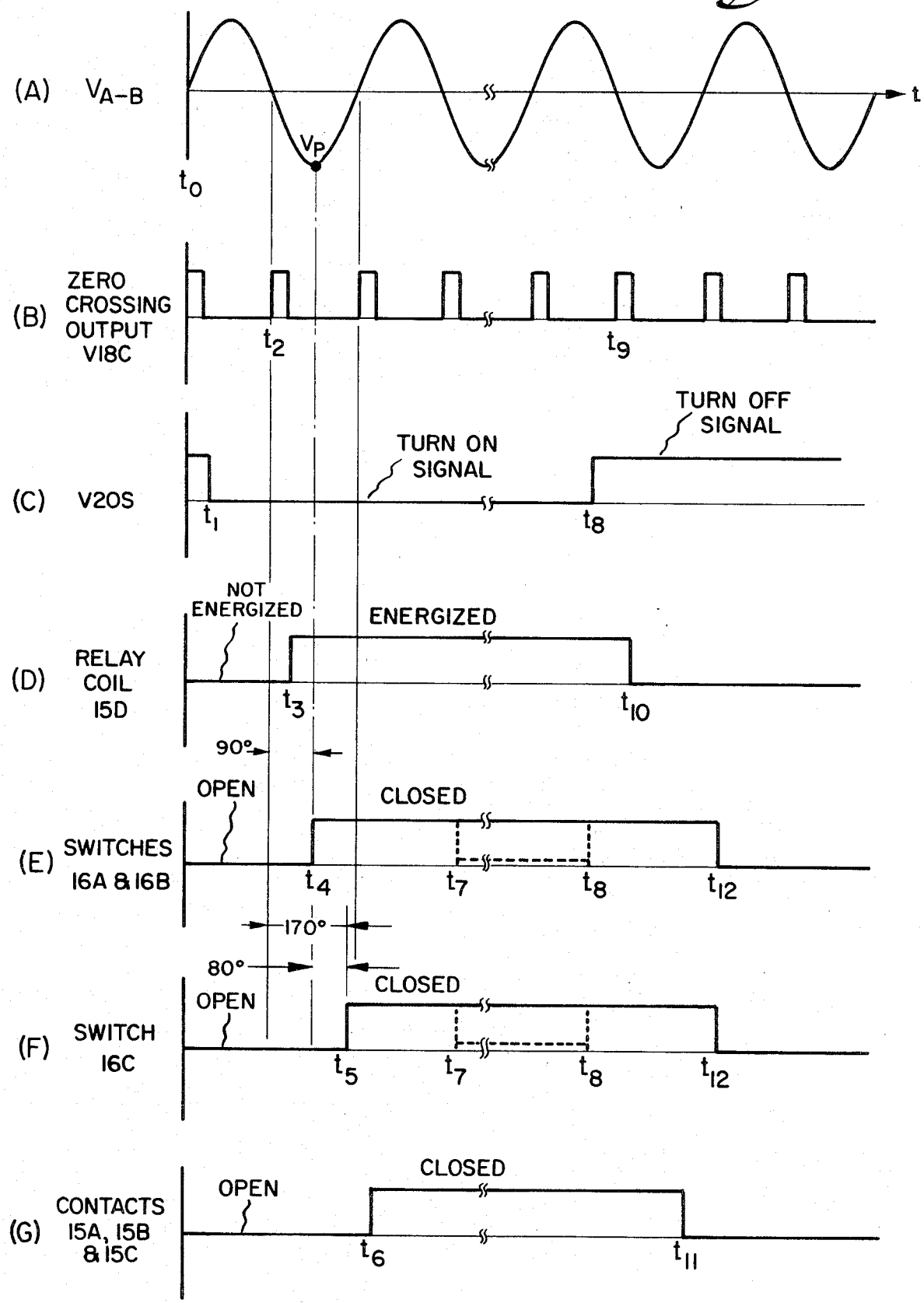
FIG. 2 is a timing diagram showing the sequence of operations for the circuit of FIG. 1.

The operation of the circuit of FIG. 1 will now be discussed with reference to the timing diagram of FIG. 2. Specifically, part A of FIG. 2 shows the voltage waveform $V_{A-B}$, which is the voltage at line 18A relative to the voltage at line 18B. Part B of FIG. 2 shows the voltage at the zero-crossing detect circuit output 18C. This output voltage V18C will consist of a series of pulses, each coinciding with one zero crossing of the sinusoidal voltage $V_{a-b}$.

Arbitrarily using time $T_0$ to represent the beginning of voltage wave form $V_{a-b}$, a turn-on signal at line 20S is generated at a later time $t_1$. The turn-on signal is shown, at part C of FIG. 2, as a low level voltage on line 20S, but a high level voltage could alternately be used. This turn-on signal may be generated at any arbitrary time after $t_0$. It may be generated by a manually-operated switch within input signal circuit 20, thereby providing turn-on and turn-off signals at terminal 20S. Alternately, a microprocessor or other control system may generate turn-on and turn-off signals, appearing at output 20S, at any arbitrary time within a cycle of the voltage waveform $V_{a-b}$. Upon the occurance of the turn-on signal on line 20S, the next zero-crossing pulse on line 18C will start the operation of phase delay and drive circuits 22, 24, and 26. This next zero-crossing signal is shown at $t_2$ of part B of FIG. 2. Next, at time $t_3$, the relay coil 15D will be energized, as shown at part D of FIG. 2. Upon the energization of relay coil 15D, the contact pairs 15A, 15B and 15C will start shifting into the closed position. However, there will be a significant time lag before contacts 15A, 15B and 15C actually start to make. In order to avoid arcing or deleterious effects of contact bounce, all of the semiconductor switching units 16A, 16B and 16C will be switched on before any of contacts 15A, 15B and 15C actually make. Specifically, at time $t_4$, which is approximately 90° after the zero-crossing at time $t_2$, semiconductor switching units 16A and 16B are switched on respectively by energizing signals appearing on lines 24A and 24B. As shown in part E of FIG. 2, time $t_4$ is at a peak $V_p$ in the voltage wave form $V_{a-b}$. Following the switching of switches 16A and 16B, and before the pairs of relay contacts 15A, 15B and 15C have closed, switch 16C is energized, or switched on, at time $t_5$, which is preferably 80° after time $t_4$ (170° after $t_2$) as shown in part F of FIG. 2. As used throughout this application, "approximately" refers to within ±10% of the stated quantity. The 90° and 80° delays are used to minimize DC offset currents caused by the integrating properties of the inductive load.

Following the time $t_5$, semiconductor switches 16A, 16B and 16C will all be energized, thus providing power from source 10 to inductive load 14. The contacts 15A, 15B and 15C may then be closed without arcing or deleterious effects of contact bounce, as at time $t_6$ of part G of FIG. 2. It should be noted that the time delay from $t_3$ (when the relay coil 15D is energized) to time $t_6$ (when the contacts actually make) may vary from relay to relay. Indeed, this time delay may vary somewhat for a particular relay. Regardless of the time delay from energizing the relay coil to the actual closing or making of the contacts, switching units 16A and 16B should be switched on at 90° after a zero crossing followed by the switching on of switching unit 16C about 80° after the switching on of switches 16A and 16B. Accordingly, the phase A+B delay and drive circuit 24 should have a delay of 90° (relative to voltage $V_{a-b}$) following the occurence of a zero-crossing signal coinciding with a turn-on signal. The phase C delay and drive circuit 26 should have a delay of approximately 170° (90° plus 80°) from the zero-crossing signal. The delay of relay coil delay and drive circuit 22 should be set such that, in the worst case, the contacts 15A, 15B and 15C will not close until after switching units 16A, 16B and 16C are switched on. Assuming that the time delay from the energization of the relay coil to the making of the contacts will be longer than the 170° for the switching on of all of the semiconductor switches, the relay coil 15D may be energized immediately after the zero crossing at time $t_2$. Alternately, if the time delay from the relay energization to the make of the contacts is extremely short, or to be especially certain that the relay contacts do not make before the semiconductor switching units are switched on, the relay coil delay and drive circuit 22 may include an amount of delay such that the relay contacts do not close before the firing of switch 16C.

Following the closing of contacts 15A, 15B and 15C, power may be supplied from source 10 to the inductive load 14 without the use of semiconductor switches 16A, 16B and 16C. Accordingly, if desired, the control circuit may turn off the semiconductor switches 16A, 16B and 16C as shown in phantom lines at time $t_7$ of parts E and F of FIG. 2. When a turn-off signal occurs on line 20S, as at time $t_8$, the switching units 16A, 16B and 16C could be essentially instantaneously turned back on as shown with reference to parts C, E, and F of FIG. 2. Alternately, as shown in solid lines, the semiconductor switches could be kept on until after the turn-off signal has occurred on line 20S. In either case, the de-energization of relay coil 15D may begin at time $t_{10}$, shortly after the zero crossing at time $t_9$. Following the time delay from the de-energization of relay coil 15D to the breaking (or opening) of contacts of 15A, 15B and 15C at time $t_{11}$, the switches 16A, 16B and 16C may all be turned off at time $t_{12}$ by opening signals on lines 26A, 24A, and 24B. The semiconductor switching units may all be turned off at the same time since, unlike the situation at startup, there is no need to be concerned about a DC offset current.

Although a specific embodiment for the system of FIG. 1 will be discussed below, it is useful to make several general observations about the phase delay and drive circuits 22, 24 and 26. Specifically, the zero crossing signals appearing on line 18C may be considered as clock signals which cause the phase delay and drive circuits to sample the signal on line 20S. When the state of the signal on line 20S changes, the outputs of the phase delay and drive circuits will in turn change state after a preset time delay from the first zero crossing which occurred after the change in state in line 20S. The phase A+B delay and drive circuit 24 is preset to cause a delay corresponding to 90°, as shown in part E of FIG. 2. This will cause the application of the phase A and the phase B voltage signals at a point corresponding to a peak value $V_p$ of voltage wave form $V_{a-b}$. The turn-on delay for the phase C delay and drive circuit 26 will be preset for 170°, as shown in part F of FIG. 2. By applying the power at these points relative to the three-phase power source voltages signals, the DC offset current caused by the voltage-integrating properties of the inductive load will be minimized. By minimizing DC offset current, the relay contacts 15A, 15B and 15C and semiconductor switching units 16A, 16B and 16C need not be rated for currents as high as would otherwise be the case. The turn-on delay for the relay coil delay and drive circuit 22 is simply set such that the contacts 15A, 15B and 15C will not be closed until all of the semiconductor switching units 16A, 16B and 16C are closed. Furthermore, because the sequence of turning off is different than the sequence of turning on, the phase delay and drive circuits 22, 24 and 26 will preferably have different turn-off delay times than the turn-on delay times. Specifically, the turn-off delay times of the phase A+B delay and drive circuit 24 and the phase C delay and drive circuit 26 may be set to be equal, thus opening all the semiconductor switching units at time $t_{12}$ as shown in parts E and F of FIG. 2.

As should be readily appreciated by one of ordinary skill in the art, either one of switching means 12A or 12B could be eliminated by directly connecting an output line to an input line. The DC offset current and arcing would still be minimized, but there would no longer be complete (e.g. on all three lines) ohmic isolation between the AC source and the load. Until the first-closing hybrid contactor switching means (12A or 12B, which ever is kept in the circuit) closes, there would be no current return path. Switching means 12C would be a later-closing hybrid contactor, closing later in time than the first closing hybrid contactor.

Figure 3:
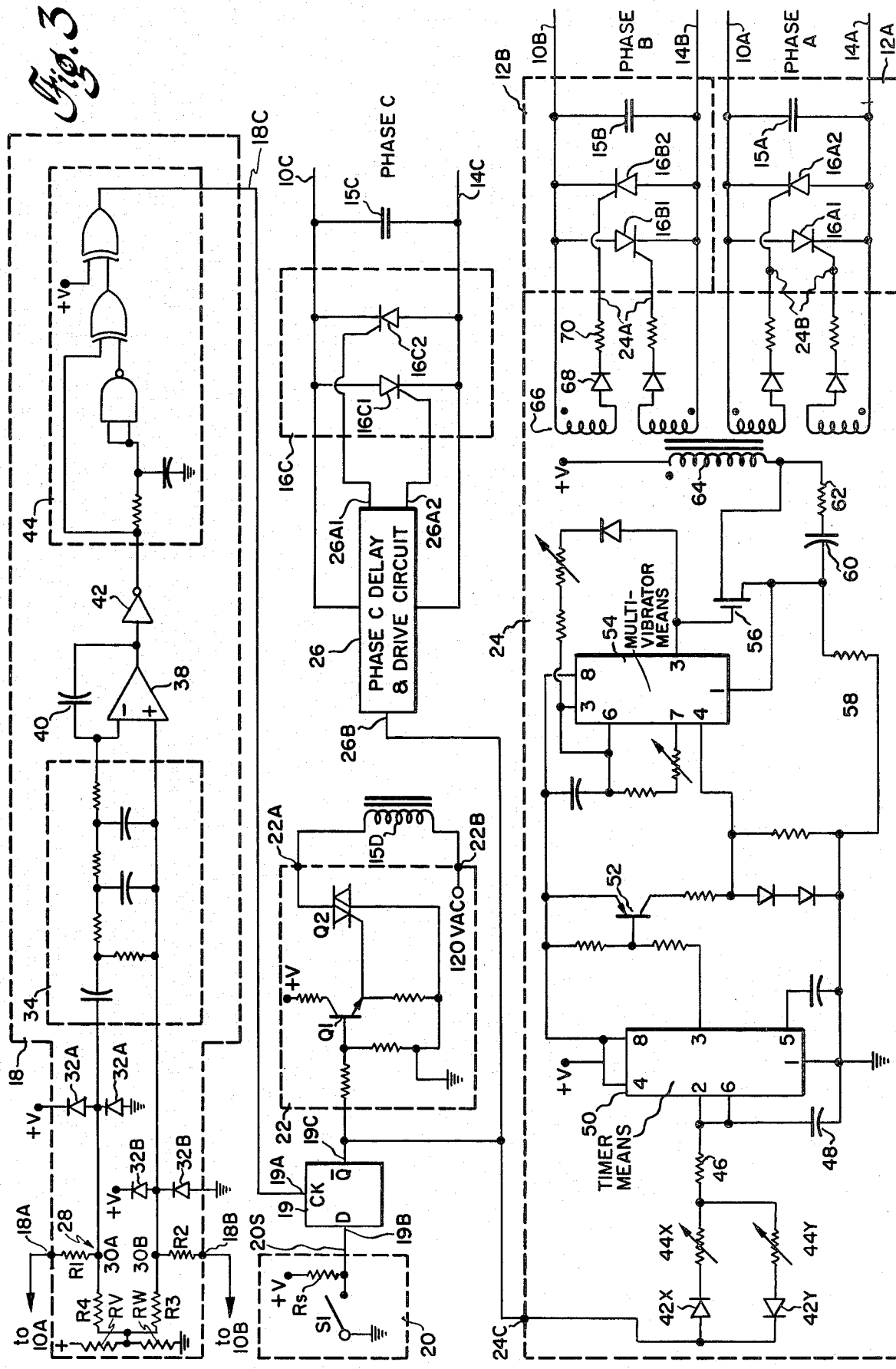
FIG. 3 is a schematic diagram showing a specific circuit for implementing the block diagram of FIG. 1.

Referring now to FIG. 3, a specific embodiment of the switching circuit comprising of control circuit 17 and hybrid contactors 12A, 12B and 12C, will be described. In zero-crossing detector circuit 18, the phase A and phase B voltage inputs 18A and 18B are respectively connected to resistors R1 and R2 which form part of a voltage divider network 28 also including resistors R3 and R4. The resistance values for the resistors in this voltage divider will be selected such that the voltages at nodes 30A and 30B will never turn-on the safety diodes 32A and 32B, which diodes insure that the voltage levels at nodes 30A and 30B do not exceed desirable levels. The voltage waveforms at nodes 30A and 30B will be sine waves in the usual case of three-phase AC power source 10 (not shown in FIG. 3) generating the sine waves at its outputs. Filter 34, which may be a simple RC filter as shown, is used for filtering out any noise on the signals at nodes 30A and 30B. The outputs of filter 34 are provided to the inputs of a comparator 38, having a feedback capacitor 40 connected between the output and the inverting input thereof. The comparator output is connected to inverter 42. The signal out of comparator 38 will be high if the phase B voltage on line 10B is higher that the phase A voltage on line 10A. The output of comparator 38 will be low if the phase A voltage is higher that the phase B voltage. Inverter 42 is used to sharpen and invert the transitions at the output of comparator 38. Accordingly, the signal provided to a one-shot, or monostable, multivibrator 44 will include a transition corresponding to each zero-crossing of the relative voltage of phase A with respect to phase B. Multivibrator 44, which may be of the standard design shown, will then produce a pulse at output 18C corresponding to each of these transitions. It will thus be appreciated that the signal at zero-crossing detect circuit output 18C will be a series of pulses, with each pulse corresponding to one of the substantial zero-crossings of the relative voltage between phase A and phase B.

The pulse train appearing on line 18C is coupled into the clock CK input 19A of a latching circuit 19, which may be a data-type flip-flop. The D input 19B of the flip-flop 19 is, in this embodiment, connected to an input signal circuit 20 comprised of a manually-operated switch S1 and a pull-up resistor $R_s$. In the configuration shown, a turn-on signal will correspond to a low level at line 20S, whereas a turn-off signal will correspond to a high level at line 20S. Alternatively, one could use a toggle-type flip-flop in place of the D flip-flop, in which case the input to the flip-flop could be provided by a momentary-contact switch instead of the switch S1 shown. Moreover, one could use a microprocessor or similar control system output for providing the turn-on signal to latch input 19B. An additional possibility is to detect the outputs of power source 10 and provide a turn-on signal on line 20s whenever the power source 10 is turned on.

Latch output 19C is provided to the relay coil delay and drive circuit 22 as shown. Relay coil delay and drive circuit 22 includes a transistor Q1 arranged to control the turn-on of a triac Q2. The values for the individual resistors within delay and drive circuit 22 may be readily selected by one of ordinary skill in the art and, therefore, need not be expressly included. In the configuration shown, there is relatively little delay in delay and drive circuit 22. However, as discussed above, delay may be included in the case of a fast-switching relay, so as to insure that the relay contacts do not make before the shunting semiconductor switching units are closed.

The flip-flop output 19C is also coupled to the input 24C of the phase A+B delay and drive circuit 24. The input signal is coupled into a timer means 50 (such as a type 555 timer integrated circuit and the like) by way of diodes 42X and 42Y, variable resistors 44X and 44Y, fixed timing resistor 46 and timing capacitor 48. Diodes 42X and 42Y allow separate adjustment of the time constant for line 19C transitions from high to low, and from low to high. These diodes will thus allow delay and drive circuit 24 to have turn-on delay which may be different from the turn-off of the circuit. That is, these diodes allow one to set the timing device in accordance with the delays shown in timing diagram FIG. 3.

The output of timing circuit 50, which is operated as an inverting Schmidt trigger, is fed into a second timing circuit 54 (such as based on an INTERSIL 7555 timer integrated circuit and the like) by way of a bipolar junction transistor 52. Timer circuit 54 is arranged as shown with various resistors and capacitors such that it will repeatedly turn a FET 56 on and off at a very high frequency. Arranged in parallel with field effect transistor 56 are resistor 62 and snubber capacitor 60, which in turn are connected to ground by way of shunt resistor 58. The turning on and off of FET 56 will repeatedly establish and collapse a magnetic field in a transformer primary winding 64. Primary winding 64 controls semiconductor switching units 16A and 16B, each semiconductor switching unit having two of the four silicon controlled rectifiers, 16A1 and 16A2 or 16B1 and 16B2.

Although each semiconductor switching unit is shown as two antiparallel-connected silicon controlled-rectifiers, one could alternately use a single three-terminal device (such as a triac and the like) as long as the applied dV/dt would be below the triac's dV/dt turn-on point. Considering, for example, controlled rectifier 16B2, the collapsing of the magnetic field in primary 64 will cause current to flow from secondary winding 66 to the gate of controlled rectifier 16B2 by way of diode 68 and current-sharing resistor 70. The arrangement is similar with respect to the other controlled rectifiers, such that the controlled rectifiers are repeatedly turned on at such a high frequency that none of the controlled rectifiers will be turned off by any momentary current level below the holding current. That is, timing circuit 54 is arranged to oscillate at a much higher frequency than the frequency of power source 10, whereby the controlled rectifiers 16A1, 16A2, 16B1 and 16B2 will be effectively maintained on as long as FET 56 is being repeatedly turned on and off.

As shown, flip-flop output 19C is also coupled to the input 26B to phase C delay and drive circuit 26. Phase C delay and drive circuit 26 is shown simply as a block, it, it being understood that this delay and drive circuit is configured substantially identical to the Phase A+B delay and drive circuit 24, except that the turn-on delay time has a separate value as defined by a resistor such as those resistors 44X and 44Y shown in the phase A and B delay and drive circuit 24. Additionally, because the output of the phase C delay and drive circuit 22 only turns on two controlled rectifiers 16C1 and 16C2, only two secondaries (such as winding 66 in phase A+B delay and drive circuit 24) need be included in the phase C delay and drive circuit 26.

Figure 4:
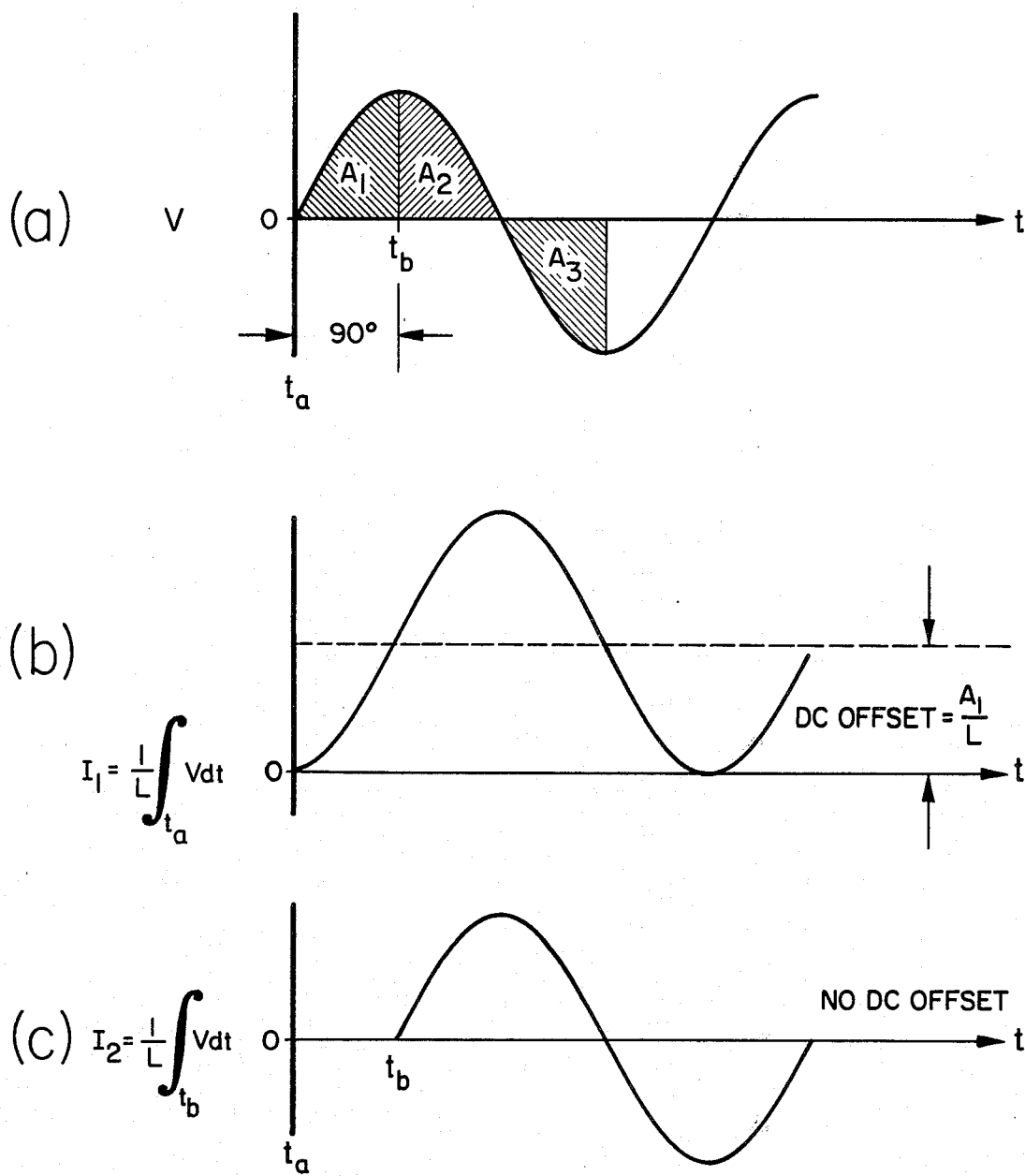
FIG. 4 is a timing diagram showing waveforms useful in understanding the principles of the present invention.

FIG. 4 shows several waveforms which are useful for demonstrating the principles of operation of the present invention, it being understood that the applicants are not bound to any particular theory. Specifically, part A of FIG. 4 shows a sinusoidal voltage waveform V. Part B of FIG. 4 shows a current waveform which would be obtained by applying the voltage V of part A to an inductance, starting at the origin at time $t_0$. Because of the integrating characteristics of the inductive load, a DC offset proportional to the area $A_1$ of part A of FIG. 4 will be obtained. However, if the voltage is not applied to the inductor until time $t_b$, there will be no DC offset in th resulting current $I_2$ as shown in part C of FIG. 4. By initially applying the voltage V to the inductor at time $t_b$, corresponding to a peak voltage value (of positive or negative polarity), DC offset in the resulting current will be eliminated because a series, of positive and negative areas such as $A_2$ and $A_3$ will cancel each other out and there will be no contribution to the current from the area $A_1$. Likewise, if the voltage V is applied to an inductive load L at any time other that a voltage peak, there will be at least some DC offset. Accordingly, when applying a voltage waveform to an inductive load, the relay contacts and/or solid state devices (used to switch the voltage on to the load) must be designed to withstand the DC offset current in addition to the AC current. If the voltage waveform V was a squarewave, instead of the sinusoidal form shown in part A of FIG. 4, the DC offset could also be minimized or eliminated by initially applying the voltage to the inductive load 90° after a zero crossing. It should be readily appreciated that in the case of a square wave of voltage input, the corresponding current waveform would be a triangular wave with the DC offset varying as a function of the phase difference between the time of applying the voltage and 90° after the zero crossing.

The principles of FIG. 4 are useful in explaining the advantageous aspects of turning on semiconductor switching units 16A and 16B 90° after the zero crossing of voltage $V_{A-B}$ as shown in part E of FIG. 2. The importance of turning on semiconductor switch 16C at 170° after the zero crossing is less readily apparent, but basically flows from the same considerations. Essentially, by turning on switch 16C at about 170° after the zero crossing, DC offset currents will be minimized by balancing out a DC offset current established by $V_c$, relative to $V_b$, against an opposite and approximately equal DC offset established by $V_c$, relative to $V_a$. That is, the preferred sequence of: turning on switching units 16A and 16B at the 90° point from the zero crossing; and then turning on switch 16C at the 170° point from the zero crossing, will minimize the DC offset established by the power supply 10 under the standard conditions of having voltage waveform $V_b$ lag voltage waveform $V_a$ by 120°, and having voltage waveform $V_c$ lag voltage waveform $V_b$ by 120°.

The present invention may be embodied in other specific forms without departing from the spirit or essential attributes thereof and, accordingly, reference should be made to the appended claims, rather than to the foregoing specification, as indicating the full scope and true spirit of the present invention.

What is claimed is:

1. A method of controlling the flow of power from an AC power source to an inductive load by way of a switching circuit comprising a control circuit operably connected to a first hybrid contactor having a pair of relay contacts connected in parallel with a switching unit including at least one switching device, the AC power source having at least one output line and the inductive load having at least one input line, said first hybrid contactor switchably electrically connecting said at least one output line to said at least one input line, the steps comprising:
   I. turning on the flow of power by:
      (a) generating a turn-on signal,
      (b) sensing a relative waveform from the output line of the AC power source,
      (c) generating an indicating signal based on said relative waveform,
      (d) switching the switching unit of the first hybrid contactor to an on state responsive to said turn-on signal and at a point in time determined by, and other than at a zero crossing of, the sensed relative waveform to cause a minimal DC offset current to be generated by the integrating property of the inductive load, and
      (e) switching the pair of relay contacts of the first hybrid contactor to assume a closed state only after the switching unit is in an on state; and
   II. turning off the flow of power by:
      (a) generating a turn-off signal,
      (b) switching the pair of relay contacts of the first hybrid contactor to an open state responsive to the turn-off signal, and
      (c) switching the switching unit of the first hybrid contactor to an off state only after the pair of relay contacts are opened, to halt the flow of power from the AC power source to the inductive load.

2. The method of claim 1 for controlling the flow of power from three output lines of a three-phase AC power source to three input lines of an inductive load by a switching circuit comprising a control circuit operably connected to first, second, and third hybrid contactors, each hybrid contactor switchably electrically connecting a corresponding one of first, second, and third of said three output lines of the AC power source to a corresponding one of first, second, and third of said three input lines of the inductive load and having a pair of relay contacts connected in parallel to a switching unit including at least one switching device, the turning on of the flow of power further comprising the steps of:
   switching the switching unit of the second hybrid contactor to an on state at the same non-zero-crossing time as the switching unit of the first hybrid contactor is switched on;
   switching the pair of relay contacts of the second hybrid contactor to a closed state only after the switching unit of the second hybrid contactor is in an on state;
   switching the switching unit of the third hybrid contactor to an on state at a point in time both (1) after the switching on of the switching units of said first and second hybrid contactors and (2) selected to cause minimal DC offset current to be generated by the integrating property of said inductive load;
   switching the pair of relay contacts of the third hybrid contactor to a closed state only after the switching unit of the third hybrid contactor is in an on state; and
the turning off of the flow of power further comprising the steps of:
   upon the occurence of the turn-off signal, switching the pair of relay contacts of each hybrid contactor to an open state responsive to the turn-off signal; and
   switching each switching unit to an off state only after the opening of the pair of relay contacts connected in parallel therewith.

3. The method of claim 2 wherein the step of switching on the switching units of the first and second hybrid contactors occurs substantially at the peak of a half-cycle of the sensed source waveform, which waveform is a relative voltage between the first and second output lines of the AC power source; and the step of switching on the switching unit of the third hybrid contactor occurs approximately 80° after that peak of the half-cycle of the sensed relative voltage at which said first and second hybrid contactors are switched.

4. The method of claim 3 further including the step of energizing a relay coil to close the pairs of relay contacts of said first, second and third hybrid contactors, the energizing of the relay coil occuring before the switching on of the switching units of the first and second hybrid contactors, and the resulting closing of the pairs of relay contacts does not occur until after the switching on of the switching unit of the third hybrid contactor.

5. The method of claim 3 wherein the indicating signal is a pulse train, with each pulse therein corresponding to a zero-crossing of said sensed relative voltage; and further including the step of using the pulse train as a clock signal for repeatedly latching in storage said turn-on signal and said turn-off signal.

6. The method of claim 5 wherein the steps of switching the switching units of the first, second and third hybrid contactors are each accomplished by: delaying a latched signal by a predetermined delay period; switching the state of the switching unit after said delay period; and, for at least one of the semiconductor switching units, setting the delay period for switching from the off state to the on state to be different than the delay period set for switching from the on state to the off state.

7. The method of claim 1 or 2 wherein the indicating signal is a pulse train, with each pulse therein generated by the occurence of a zero-crossing in said sensed relative waveform.

8. The method of claim 1, 2 or 3 further including the step of repeatedly latching into storage said turn-on signal and said turn-off signal.

9. The method of claim 2 wherein the step of switching on the switching units of the first and second hybrid contactors occurs approximately 90° after a zero crossing of said sensed waveform, which waveform is a relative voltage between the first and second output lines of the AC power source; and the step of switching on the switching unit of the third hybrid contactor occurs approximately 170° after a zero-crossing of said sensed relative voltage.

10. The method of claim 9 wherein the indicating signal in a pulse train with each pulse corresponding to a zero crossing in said relative voltage; and further including the step of using the pulse train as a clock signal for repeatedly latching into storage said turn-on signal and said turn-off signal; and wherein the steps of switching the switching units of the first, second and third hybrid contactors are each accomplished by: delaying a latched signal by a predetermined delay period; switching the state of the switching unit after said delay period; and, for at least one of the switching units, setting the delay period for switching from the off state to the on state to be different than the delay period set for switching from the on state to the off state.

11. A circuit system having at least a switching circuit for switchably supplying power from first, second, and third output lines of a three-phase AC power source to respectively corresponding first, second, and third input lines of an inductive load, said switching circuit comprising:
   two switching means, each switching means for independently switchably electrically connecting a different output line of the AC power source to a corresponding different input line of the inductive load; and
   a control circuit including a detect circuit for sensing the relative voltage between two of the three output lines of the AC power source and for generating an indicating signal circuit for generating a turn-on signal, said control circuit causing a first-closing one of said two switching means to close responsive to the turn-on signal and at a point in time determined by the sensed relative voltage to cause a minimal DC offset current to be generated by the integrating property of the inductive load, and said control circuit causing a second-closing one of said two switching means to close at a point in time after the closing of the first-closing one of said switching means to cause a minimal DC offset current to be generated by the integrating property of the inductive load.

12. The circuit system of claim 11 wherein the control circuit closes the first-closing switching means substantially at the peak of a half-cycle of the sensed relative voltage.

13. The circuit system of claim 11 wherein the detect circuit is a zero-crossing detector; and the control circuit closes the first-closing switching means approximately 90° after a zero-crossing of said relative voltage.

14. The circuit system of claim 13 wherein said control circuit of adapted to close the second-closing switching means approximately 170° after a zero crossing of said relative voltage.

15. The circuit system of claim 14 wherein said control circuit is adapted to close the second-closing switching means approximately 170° after the same zero crossing which precedes by approximately 90° the closing of the first-closing switching means.

16. The circuit system of claim 13 wherein the control circuit further includes at least two delay and drive circuits, each delay and drive circuit connected to receive both said indicating signal from said detect circuit and said turn-on signal from said input signal circuit, each delay and drive circuit operable to provide a closing signal to a connected one of said two switching means, each closing signal occuring after a predetermined delay from said indicating signal.

17. The circuit system of claim 16 wherein: each of said two switching means is a hybrid contactor having a pair of relay contacts in parallel with an associated semiconductor switching unit including at least one semiconductor switch; said control circuit closes each switching means by first causing the associated semiconductor switching unit to conduct before closing the pair of associated relay contacts; said input signal circuit generates a turn-off signal; said control circuit responds to said turn-off signal by opening said two switching means, each pair of relay contacts being opened before the parallel semiconductor switching unit is opened; and wherein the control circuit further includes a relay coil drive circuit.

18. The circuit system of claim 17 wherein the two delay and drive circuits respond to a turn-off signal by each generating opening signals which cause the opening of the associated semiconductor switch.

19. The circuit system of claim 18 wherein said sensed relative voltage is a relative voltage between the first and second output lines of the AC power source, said first-closing switching means switchably electrically connecting the first output line of the AC power source to the first input line of the inductive load, and said second-closing switching means switchably electrically connecting the third output line of the AC power source to the third input line of the inductive load.

20. The circuit system of claim 19 wherein said switching circuit further includes another hybrid contactor, said another hybrid contactor switchably electrically connecting the second output line of the AC power source to the second input line of the inductive load, said another hybrid contactor having a pair of relay contacts in parallel to a semiconductor switching unit including at least one semiconductor switch, and said control circuit is adapted to close said another hybrid contactor by first closing its semiconductor switching unit prior to closing the associated pair of relay contacts.

21. The circuit system of claim 20 wherein said control circuit also operates to close and open the semiconductor switching unit of said another hybrid contactor at the same times as the respective opening and closing of said semiconductor switching unit of said first-closing switching means.

22. The circuit system of claim 21 wherein the control circuit further includes a latching circuit clocked by said indicating signal to latch into a state dependent on the presence of a turn-on signal or turn-off signal, an output of the latching circuit being coupled to an input of each the two delay and drive circuits and the relay coil drive circuit.

23. The circuit system of claim 22 wherein said indicating signal is a pulse train corresponding to zero crossings of the relative voltage.

24. The circuit of claim 23 wherein each of the semiconductor switching units is a pair of antiparallel-connected controlled rectifiers.

25. The circuit system of claim 23 wherein the control circuit causes the first-closing switching means to close at 90° after a zero-crossing of said relative voltage and causes the second-closing switching means to close 80° later.

* * * * *